United States Patent

Hill

(10) Patent No.: US 9,515,449 B2
(45) Date of Patent: Dec. 6, 2016

(54) METAL-INSULATOR-METAL WAVEGUIDE FOR NANO-LASERS AND OPTICAL AMPLIFIERS

(71) Applicant: Martin Terence Hill, Warwick (AU)

(72) Inventor: Martin Terence Hill, Warwick (AU)

(*) Notice: Subject to any disclaimer, the term of this patent is extended or adjusted under 35 U.S.C. 154(b) by 0 days.

(21) Appl. No.: 14/410,909

(22) PCT Filed: Jun. 28, 2013

(86) PCT No.: PCT/AU2013/000703
§ 371 (c)(1),
(2) Date: Dec. 23, 2014

(87) PCT Pub. No.: WO2014/000046
PCT Pub. Date: Jan. 3, 2014

(65) Prior Publication Data
US 2015/0188280 A1    Jul. 2, 2015

(30) Foreign Application Priority Data

Jun. 29, 2012   (AU) .................................. 2012902797

(51) Int. Cl.
| | | |
|---|---|---|
| *G02B 6/10* | (2006.01) | |
| *G02B 6/12* | (2006.01) | |
| *H01S 3/067* | (2006.01) | |
| *H01S 5/10* | (2006.01) | |
| *H01S 5/22* | (2006.01) | |

(Continued)

(52) U.S. Cl.
CPC ............ *H01S 3/06708* (2013.01); *B82Y 20/00* (2013.01); *G02F 1/01708* (2013.01);
(Continued)

(58) Field of Classification Search
CPC .... H01S 3/06754; H01S 3/067; H01S 3/0675; H01S 3/06708; H01S 3/06766; H01S 5/1064; G02F 1/01708; B82Y 20/00
(Continued)

(56) References Cited

U.S. PATENT DOCUMENTS

| | | | |
|---|---|---|---|
| 7,693,198 B2* | 4/2010 | Sekiguchi .............. | B82Y 20/00 372/102 |
| 2003/0123829 A1* | 7/2003 | Taylor .................. | H01L 29/7785 385/131 |

(Continued)

OTHER PUBLICATIONS

Hill, et al., "Lasing in metal-insulator-metal sub-wavelength plasmonic waveguides", Optics Express, Jun. 22, 2009, vol. 17, No. 13, pp. 11107-11112.
(Continued)

*Primary Examiner* — Kaveh C Kianni
*Assistant Examiner* — Hung Lam
(74) *Attorney, Agent, or Firm* — Hamre, Schumann, Mueller & Larson, P.C.

(57) ABSTRACT

A metal-insulator-metal (MIM) waveguide structure for nano-lasers or optical amplifiers is described. The structure comprises a substrate on which are supported first and second metal layers which form electrical contacts for the waveguide. A narrow ridge of low-band gap semiconductor core, which forms the optical gain material, is sandwiched between the two metal layers. The semiconductor core is surrounded on both sides by a low refractive index material which is also sandwiched between the two metal layers. First and second layers of thin higher-band gap doped semiconductor material are provided between the respective first and second metal layers and the low-band gap semiconductor core and the low refractive index material. The optical mode that propagates down this waveguide is localized in the center of the waveguide structure where the narrow ridge of low-band gap semiconductor core is.

20 Claims, 11 Drawing Sheets

(51) Int. Cl.
 *B82Y 20/00* (2011.01)
 *G02F 1/017* (2006.01)
 *H01S 5/042* (2006.01)
 *H01S 5/34* (2006.01)

(52) U.S. Cl.
 CPC ........ *H01S 3/06754* (2013.01); *H01S 5/1046* (2013.01); *H01S 5/1064* (2013.01); *H01S 5/2205* (2013.01); *H01S 5/0425* (2013.01); *H01S 5/2213* (2013.01); *H01S 5/3412* (2013.01)

(58) Field of Classification Search
 USPC .................. 385/129–132, 142, 144; 372/6, 7
 See application file for complete search history.

(56) References Cited

U.S. PATENT DOCUMENTS

| | | |
|---|---|---|
| 2006/0126689 A1 | 6/2006 | Hong et al. |
| 2012/0292512 A1* | 11/2012 | Koyama ............... H01S 5/1046 250/338.4 |
| 2012/0296589 A1* | 11/2012 | Koyama ............... B82Y 20/00 702/66 |
| 2012/0300796 A1* | 11/2012 | Sysak .................. H01S 5/1032 372/6 |

OTHER PUBLICATIONS

Hill, "Metallic nano-cavity lasers at near infrared wavelengths", Proc. SPIE 7394, Plasmonics: Metallic Nanostructures and their Optical Properties VII, 739409, Sep. 2, 2009.

Hill, "Electrically pumped gap-plasmon mode semiconductor core lasers", Proc. SPIE 7757, Plasmonics: Metallic Nanostructures and Their Optical Properties VIII, 77570S, Sep. 10, 2010.

Hill, "Infrared Plasmonic nano-lasers based on Metal Insulator Metal waveguides" $23^{rd}$ Annual Meeting of the IEEE Photonics Society, Nov. 7-11, 2010, pp. 696-697.

* cited by examiner

METAL-INSULATOR-METAL WAVEGUIDE FOR NANO-LASERS AND OPTICAL AMPLIFIERS

FIELD OF THE INVENTION

The present invention relates to the improved design of a metal-insulator-metal (MIM) waveguide structure and a method of manufacture of the same and relates particularly, though not exclusively, to metallic/plasmonic nano-lasers and optical amplifiers based on such a MIM waveguide structure.

BACKGROUND TO THE INVENTION

Reducing the size of lasers and other photonic devices produces benefits similar to those seen with the shrinking dimensions of electronic components. A smaller laser requires less power and can potentially be switched on and off faster. In theory it is possible to use metals to form the laser resonator. The metal may form either strong compact mirrors, able to confine light to about the size of the diffraction limit. Alternatively, the light may interact strongly with the free electrons in the metal, being guided in the form of surface plasmon polaritons (SPPs) at the interface between a metal (conductor) and a dielectric (non-conducting) material such as air. Structures employing this form of light confinement have minimum size scales related to the penetration depth of light into the metal, which is typically of the order of tens of nanometers. Unfortunately, the metal conduction electrons which oscillate in synchronism with the optical field dissipate energy through collisions with the metal's atomic lattice. This energy dissipation leads to high optical losses, so SPPs can only travel short distances and metal mirrors have higher losses than dielectric ones. A number of workers have examined the possibility of using gain in metallic waveguides.

In the last couple of years efforts to use metals to form the nano-laser resonator has shown it is indeed possible for an optical gain medium to compensate the high optical losses. Furthermore, metals have allowed both the overall size of the laser to be reduced to smaller than the wavelength of light, and also the optical mode dimensions to be reduced below the diffraction limit. Some of these devices are coming close to being useful light sources, and it may only be a few years before we see lasers based on metallic nano structures in applications. Metallic or plasmonic nano-lasers could become technologically significant, particularly when the laser and mode size can be reduced far below the diffraction limit. Some of the major reasons for this significance are as follows: 1) There is a perceived need for small fast low power lasers to cope with the increasing bandwidth of inter and intra integrated circuit communications. 2) New applications may appear based on the ability to make arrays of coherent emitters with sub-wavelength pitch. 3) These metallic devices could offer improved light emitters compared to dielectric cavity devices, particularly for the longer wavelengths. 4) Ultra high speed low power lasers may open up the possibility for optical signal processing that is competitive with electronics in the high performance region. 5) Finally these devices will also be important sources and amplifiers for sub-wavelength plasmonic circuits.

The present invention is concerned with improved designs for the realization of metallic/plasmonic lasers and optical amplifiers based on MIM waveguide structures which include electrical pumping of the semiconductor gain medium. Electrical pumping is a key requirement for the practical application of small lasers based on metallic structures. In particular it is shown here that the proposed electrically pumped MIM waveguide design allows for the miniaturization of the semiconductor gain medium down to sizes where quantum confinement effects occur. Quantum confined semiconductor gain medium in one or more dimensions exhibits improved characteristics such as increased optical gain for a given carrier density, higher maximum optical gain, reduced temperature effects, higher differential optical gain resulting in possibly higher laser modulation frequency.

In the past there have been two major approaches to achieve lasing in MIM waveguides, and in particular those that propagate a plasmon gap or TM0 (Transverse Magnetic, lowest order) mode. The plasmon gap mode has the advantage that the size of the insulator between the two pieces of metal can be reduced to an arbitrary small size and still propagate a mode, permitting true deep sub-wavelength confinement of light. The first approach has been used in the past for wavelengths in the mid and far infra-red (approximately >3 microns). Here, the semiconductor gain medium is sandwiched between two pieces of metal which form the electrical n-type and p-type contacts. Generally a thin layer of titanium or other adhesive metal is used between the semiconductor and gold to assist adhesion of the metal to the semiconductor. Also there are often specific doped semiconductor layers close to the metal to achieve a low contact resistance between the metal and semiconductor.

A typical prior art MIM waveguide structure employing this approach is illustrated in FIG. 1, which illustrates in schematic cross-section a MIM waveguide containing electrically pumped semiconductor, used for long wavelength semiconductor lasers. This form of electrically pumped MIM waveguide represents the state of the art when the semiconductor core is thick (>1 micron), and the wavelength of light is long.

For the longer wavelengths at which such devices operate, the metal losses are low and the extra losses due to the titanium layer are acceptable. Furthermore the semiconductor layer between the metal is typically several microns thick. The thickness of this layer permits the use of n and p doped contact layers in the semiconductor, while still having a significant proportion of the semiconductor as undoped gain medium. For shorter wavelengths, and when the size of the semiconductor region is to be reduced down to a thickness of a few hundred nanometers or less, then this simple approach of making direct electrical contacts to the semiconductor with the confining metal becomes problematic. The problems arise due to the following factors: adhesive metals such as titanium introduce significant optical losses at these shorter wavelengths and so, are difficult to employ. Furthermore to reduce optical losses of the noble confining metal and also to improve the contact resistance of the metal to the semiconductor, the noble metal is often annealed at high temperatures. When the metal is placed directly on the semiconductor, this annealing process typically causes elements of the semiconductor to dissolve into the noble metal, and the noble metal to penetrate into the semiconductor PIN junction. Apart from disturbing the purity and crystal structure of the noble metal, the actual PIN junction can be short circuited.

Currently small electrically pumped MIM waveguide plasmon mode lasers operating at near infra-red wavelengths (~1.5 microns) are realized with a different concept, as illustrated in FIG. 2, [1], [2], [3], [4]. FIG. 2 is a schematic cross-section of a MIM waveguide with electrically pumped semiconductor which permits small core width (90 nm) and short wavelength operation. Here a rectangular cross-section pillar is etched into a complex semiconductor heterostructure. The middle of the pillar structure contains a high index, lower band-gap semiconductor, in this case InGaAs (Indium gallium arsenide). A slightly lower index, higher bandgap semiconductor (here InP) surrounds the center region. The pillar is coated in a thin dielectric layer, and then encapsulated in metal. The plasmon gap mode is only weakly localized in the middle of the pillar waveguide, overlapping the InGaAs, due to the slightly higher refractive index of the InGaAs. InP has a refractive index of 3.17, while that of InGaAs is slightly higher (14%) at 3.6.

Effectively the MIM structure is turned 90° onto its side. At the top of the pillar the dielectric layer is removed and special contact metals and semiconductor are used to make a good electrical contact. Around the base of the pillar adhesive metals are also used to bond the metal noble metal to the semiconductor structure. The other electrical contact is made off to the side of the device, and current can flow through the substrate, up the InP below the InGaAs, into the InGaAs gain material. The other top contact completes the circuit through the top InP layer.

In essence the MIM waveguide structure of FIG. 2 consists of two metal layers with a core (the layer between the two metal layers) comprised of semiconductor. The MIM structure consists of three distinct waveguide sections: A middle section containing the lower bandgap semiconductor (InGaAs) core; and, either side of the middle section are two sections of MIM waveguide which contain a higher bandgap semiconductor (InP). The contrast between the effective refractive indices of the waveguide sections is only slight due to the similar high refractive indices of the semiconductor materials (InGaAs and InP).

The waveguide sections also contain two thin dielectric layers between the semiconductor materials and the metal. These layers are made as thin as possible, and with as high a refractive index dielectric as possible, to maximise the energy of the optical mode confined in the InGaAs region [2]. In the prior art realised devices, SiN with a relatively high refractive index for a dielectric of 2 was used.

With the structure of FIG. 2, a number of important problems are solved. The electrical contacts are located well away from the optical mode, allowing the use of low bandgap semiconductors, low contact resistance metals, and annealing to make good, reliable contacts. Near the optical mode, the metal is separated from the semiconductor by a dielectric layer allowing high temperature annealing to improve the optical loss of the metal. Furthermore, near the optical mode there is only the low optical loss noble metal. However, as the active region in this particular structure is reduced in size, limitations in the approach appear.

FIG. 3 shows an idealized cross-section for such a waveguide with the height (h) of the InGaAs region set at 90 nanometers (nm) and the width (W) of the InGaAs region varied from 300 to 20 nm. The width of the insulator on the sidewalls of the pillar is 5 nm and the refractive index of the insulator is 2. The active semiconductor region is InGaAs, while the higher bandgap semiconductor InP. SiN (Silicon Nitride), which has a relatively high refractive index for a dielectric of 2, is used as the insulating dielectric layer between the semiconductor and the metal, which here is silver. The InGaAs/InP semiconductor materials are useful for wavelengths in the region of 1.5 microns, however other compound semiconductor materials could be used to cover different wavelength regions, or give different characteristics.

A mode solver is used to numerically calculate the electric field profile of the electromagnetic mode that propagates in the waveguide. From such a mode profile the overlap of the electric field with the InGaAs gain medium and the metal can be found, and from these values the amount of optical gain required from the InGaAs gain medium to overcome optical losses from the metal can be calculated. The gain required to overcome losses and also the percentage of the mode energy contained in the InGaAs gain region are plotted in FIG. 4. This gain is important to know as it determines if it is possible to make a laser or amplifier with the waveguide. The gain as a function of InGaAs width is shown in by the solid curve.

From FIG. 4 it can be seen that as the width of the active region is reduced down to a few tens of nanometers, the gain required to overcome losses increases greatly (solid curve in FIG. 4) and also the amount of modal energy in the gain region reduces. The high gains required for the smaller widths would be difficult to achieve with semiconductor gain materials. Thus for smaller widths, this waveguide concept is not suitable for lasers or amplifiers. The percentage of modal energy in the InGaAs versus InGaAs width is shown by the dashed line in FIG. 4. It can be seen that for small widths, there is very little energy in the InGaAs. The key problem with this prior art waveguide design [1], [2], [3], [4] is that as the width of the waveguide is reduced, the energy of the mode goes into the dielectric layer and is poorly confined on the InGaAs region.

In general, to make useful devices such as lasers or amplifiers, it is desirable to have the gain required to overcome metallic losses as low as possible, along with a large proportion of the modal energy overlapping the gain medium. The lower gain will translate to lower threshold currents, and the higher proportion of energy in the gain medium will allow for a higher net amplification along the metallic waveguide. The higher net amplification can result in smaller and more efficient lasers and amplifiers.

The present invention was developed with a view to providing a MIM waveguide structure with improved design that is less susceptible to the above-noted problems with prior art MIM waveguide structures.

References to prior art in this specification are provided for illustrative purposes only and are not to be taken as an admission that such prior art is part of the common general knowledge in Australia or elsewhere.

SUMMARY OF THE INVENTION

According to one aspect of the present invention there is provided a metal-insulator-metal (MIM) waveguide structure' for nano-lasers or optical amplifiers, the structure comprising:

a substrate on which are supported first and second metal layers which form electrical contacts for the waveguide structure; and, a narrow ridge of low-band gap semiconductor core, which forms the optical gain material, sandwiched between the two metal layers and surrounded on both sides by a low refractive index material; and, first and second layers of thin higher-band gap doped semiconductor material provided between the respective first and second metal layers and the low-band gap semiconductor core and the low refractive index material wherein, in use, the gain required to overcome metallic loss in the waveguide is reduced because of a strong effective refractive index discontinuity at the interface of the optical gain material and low refractive index material.

Such a strong effective refractive index discontinuity is not possible if the optical gain material is surrounded on both sides with a semiconductor material, as in the prior art, FIG. 3. Note that in the prior art, FIG. 3, [2], [3], [4], the semiconductor core of the middle section of the MIM waveguide is surrounded on two sides by semiconductor (InP) which has a high refractive index (3.17). On the other two sides it is surrounded by a thin dielectric layer and then metal (Ag). In contrast the improved MIM waveguide structure of the present invention has the middle semiconductor core surrounded on both sides by a low refractive index material.

Preferably the waveguide structure further comprises first and second thin dielectric layers respectively provided between the first layer of doped semiconductor material and the first metal layer, and the second layer of doped semiconductor material and the second metal layer. Advantageously the improved MIM waveguide structure still provides an electrical path to the optical gain material via the higher-band gap doped semiconductor layers.

Preferably the first and second layers of metal are of a noble metal such as silver. Preferably the first and second layers of noble metal are annealed to improve the crystal structure and also causing it to mix with the electrical contacts and bonding it to the wafer surface.

The low-band gap semiconductor core of the waveguide structure does not have to be a homogeneous material. For example, via epitaxial growth the semiconductor core could be made of layers of lower and higher band gap material, like in a multi-quantum well gain medium. Alternatively, via various chemical etching processes, the semiconductor core region can also be etched to achieve only a thin section of low band-gap active material in the centre of the waveguide structure.

In one form of the invention the optical gain material is InGaAs semiconductor material which is suitable for optical wavelengths in the region of 1.5 micron. Preferably the low refractive index material, provided on both sides of the optical gain material, is an insulating, non-semiconductor material with a refractive index of less than 1.5. In a preferred form of the invention the low refractive index material is air, which has a refractive index of 1.0, giving the strongest effective refractive index discontinuity at the interface.

Preferably the size and shape of the optical gain material is a few tens of nanometers or less in two or more dimensions, thus allowing improved gain medium characteristics, and permitting local control of the emission and absorption wavelengths of the optical gain medium, due to quantum confinement effects. Preferably the local control of emission and absorption wavelengths along the MIM waveguide is employed for creating active (absorbing or amplifying) sections of waveguide, or passive (only guides light, without amplification) sections of waveguide.

According to another aspect of the present invention there is provided a method of manufacturing a metal-insulator-metal (MIM) waveguide structure for nano-lasers or optical amplifiers, the method comprising the steps of:

growing an epitaxial wafer via standard semiconductor techniques, the epitaxial wafer comprising a first substrate layer, a n-InP layer, a low-band gap semiconductor core layer, and a p-InP layer on top;

depositing a first layer of metal over the wafer;

bonding a second wafer substrate to the first metal layer to form a bonded wafer;

removing the first substrate layer to expose the n-InP layer;

depositing a second layer of metal over the wafer and then removing the metal from areas outside the desired MIM waveguide structure; and, removing the semiconductor core material under the second metal layer and n-InP layer and replacing it with a low refractive index material to leave just a narrow ridge of semiconductor core material in the centre of the waveguide structure wherein, in use, the gain required to overcome metallic loss in the resultant waveguide is reduced because of the strong refractive index discontinuity effective at the interface of the optical gain material and low refractive index material.

Preferably the method further comprises, prior to the step of depositing a first layer of metal, the steps of:

coating the p-InP layer with a first thin dielectric layer; and, patterning the first thin dielectric layer to make openings for a first set of electrical contacts;

and, prior to the step of depositing a second layer of metal, the step of:

coating the n-InP layer with a second thin dielectric layer.

Preferably the first and second layers of metal are of a noble metal such as silver. Preferably the method further comprises the steps of annealing the first and second layers of noble metal to improve the crystal structure and also causing it to mix with the electrical contacts and bonding it to the wafer surface.

Typically the method further comprises, prior to the step of coating the n-InP layer with the second dielectric layer, the steps of:

defining an accurate etch mask on top of the bonded wafer, which defines the critical dimensions and shape of the MIM waveguide; then reactive ion etching (RIE) dry etching to transfer this pattern isotropically into the wafer.

Preferably lithography is used to limit the second dielectric layer just to a region approximately in the middle of the plateau formed in the last step, permitting electrical contacts to be made at the edges of the plateau.

Additional layers of other metals may possibly be used to protect the silver and be used as etching masks. Preferably the low refractive index material is air, which has a refractive index of 1.0, giving the strongest refractive index discontinuity effective at the interface.

Preferably the size, shape and position of the optical gain material along any point in the waveguide structure is controlled during manufacture by the lithographic definition of the waveguide shape and dimensions, and the etching processes used to remove or transform the low band-gap semiconductor core.

Typically selective wet chemical processes of either etching or oxidization are used to remove the semiconductor core material under the second metal layer and n-InP layer, starting from the sides, and replace it with the low refractive index material. Preferably removal of the semiconductor core material progresses uniformly from each side, leaving a section of semiconductor core material in the centre of the waveguide structure below a plateau of the second metal layer and n-InP layer. Advantageously by controlling the etch time, and also the shape of the edges of the etch mask used to transfer the etch mask pattern isotropically into the wafer, great control over the size, shape and position of the semiconductor core material in the centre of the waveguide structure can be achieved. Typically the etching processes used to remove or replace the semiconductor core material can to some extent be used to transfer the pattern of the InP layer at the edge of the waveguide into the semiconductor core material that remains in the centre of the waveguide structure.

In a described embodiment, the semiconductor core material removed is InGaAs, which is replaced with air or another suitable low refractive index material with a refractive index of less than 1.5, and wherein the amount of removal or replacement is controlled to leave just a narrow ridge of InGaAs semiconductor core material in the centre of the waveguide structure.

Throughout the specification, unless the context requires otherwise, the word "comprise" or variations such as "comprises" or "comprising", will be understood to imply the inclusion of a stated integer or group of integers but not the exclusion of any other integer or group of integers. Likewise the word "preferably" or variations such as "preferred", will be understood to imply that a stated integer or group of integers is desirable but not essential to the working of the invention.

BRIEF DESCRIPTION OF THE DRAWINGS

The nature of the invention will be better understood from the following detailed description of several specific embodiments of an improved MIM waveguide structure and method of manufacturing the same, given by way of example only, with reference to the accompanying drawings, in which:

FIG. 5 (b) is a schematic perspective view of the improved MIM waveguide structure of FIG. 5 (a);

DETAILED DESCRIPTION OF PREFERRED EMBODIMENTS

Figure 5:
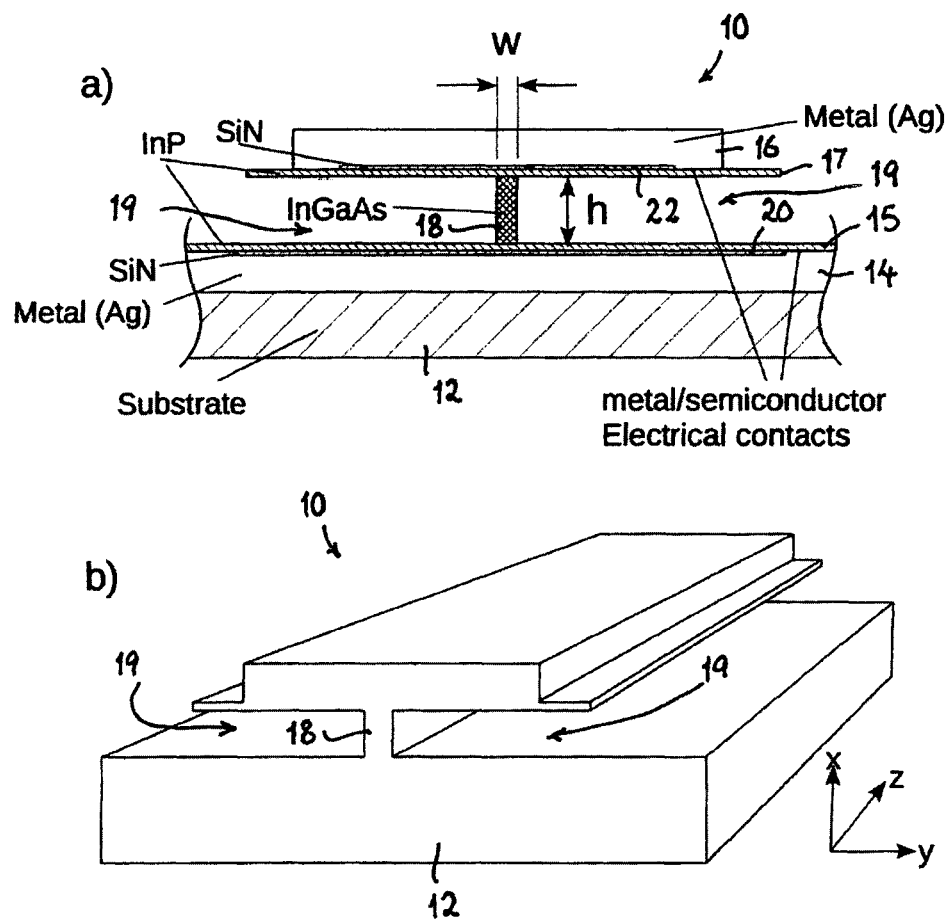
FIG. 5 (a) illustrates in cross-section view a first embodiment of an improved MIM waveguide structure in accordance with the present invention.

A first embodiment of an improved MIM waveguide structure 10 in accordance with the invention, as illustrated in FIG. 5, comprises a substrate 12 on which are supported first and second metal layers 14 and 16 which form electrical contacts for the waveguide. A narrow ridge of low-band gap semiconductor core 18, which forms the optical gain material, is sandwiched between the two metal layers 14 and 16. The semiconductor core 18 is surrounded on both sides by a low refractive index material 19 which is also sandwiched between the two metal layers 14 and 16. First and second layers of thin higher-band gap doped semiconductor material 15 and 17 are provided between the respective first and second metal layers 14 and 16 and the low-band gap semiconductor core 18. The improved MIM waveguide structure still provides an electrical path to the optical gain medium via the thin higher-band gap doped semiconductor layers 15 and 17. The optical mode that propagates down this waveguide is localised in the centre of the waveguide structure where the narrow ridge of low-band gap semiconductor core 18 is. The light propagates down the waveguide in the direction of the z axis in FIG. 5 (b).

In the illustrated embodiment the low-band gap semiconductor core 18 is formed of InGaAs semiconductor material, which is suitable for optical wavelengths in the region of 1.5 micron. The first and second layers of thin higher-band gap doped semiconductor material 15 and 17 are formed of p-InP and n-InP doped semiconductor material respectively. However other compound semiconductor materials could be used to cover different wavelength regions, or to give different waveguide characteristics. The low refractive index material 19 typically has a refractive index of less than 1.5. The low refractive index material 19 in this embodiment is air, however it will be understood that other suitable low refractive index materials, such as a vacuum, polymer or other insulator, could be used.

Figure 6:
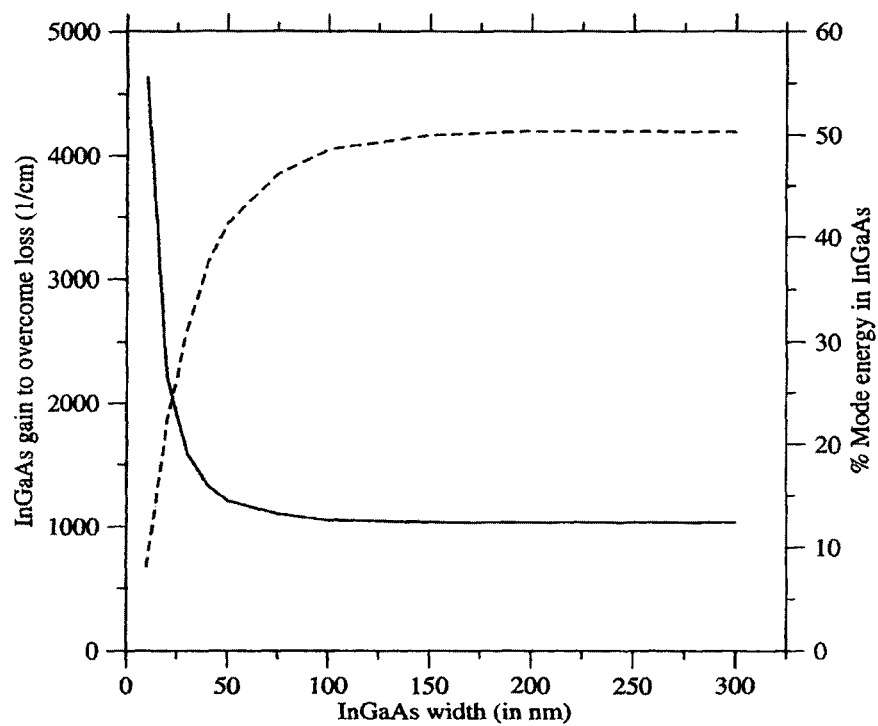
FIG. 6 is a graph plotting the semiconductor gain required to overcome metallic loss in the MIM waveguide structure of FIG. 5.

A plot of the semiconductor gain required to overcome metallic loss in the waveguide structure 10 shown in FIG. 5, is given in FIG. 6 for various widths (W) of the semiconductor core 18 with the InGaAs height (h) set at 90 nm. As in FIG. 4, calculations solve for the electric field profile of the waveguide mode which propagates down the MIM waveguide. Again the amount of optical gain required from the InGaAs to overcome optical loss is plotted in the solid curve. It can be seen that as the width of the InGaAs region 18 is reduced, the gain required to overcome the metallic losses does not increase too dramatically, even down to extremely small widths of 10 nm. The gain is reduced by almost a factor of 10 at small widths compared to the structure of FIG. 3. This improvement in gain makes it viable to have lasers and amplifiers in this waveguide structure, even with very small InGaAs regions.

Figure 1:
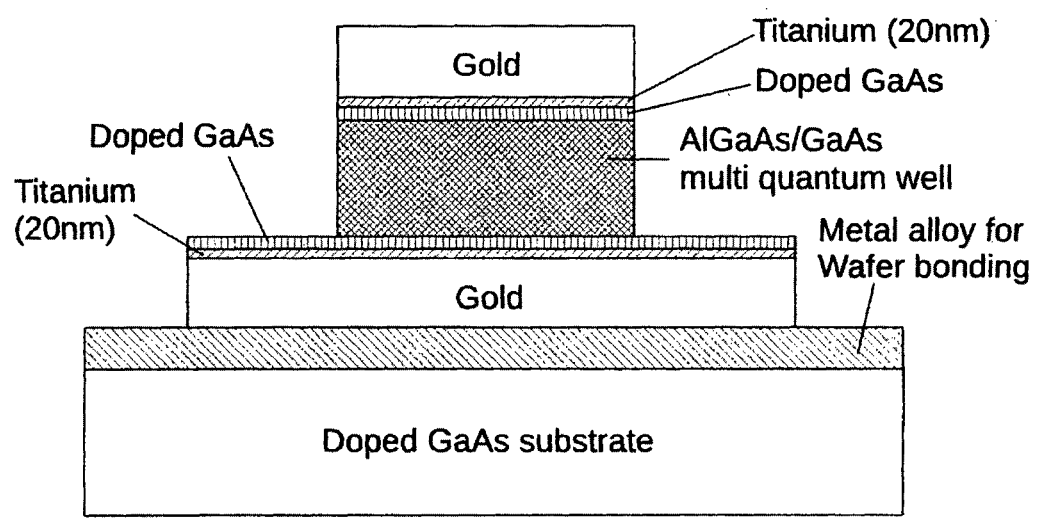
FIG. 1 illustrates in cross-section view a typical prior art MIM waveguide structure employing a plasmon gap mode.
Figure 2:
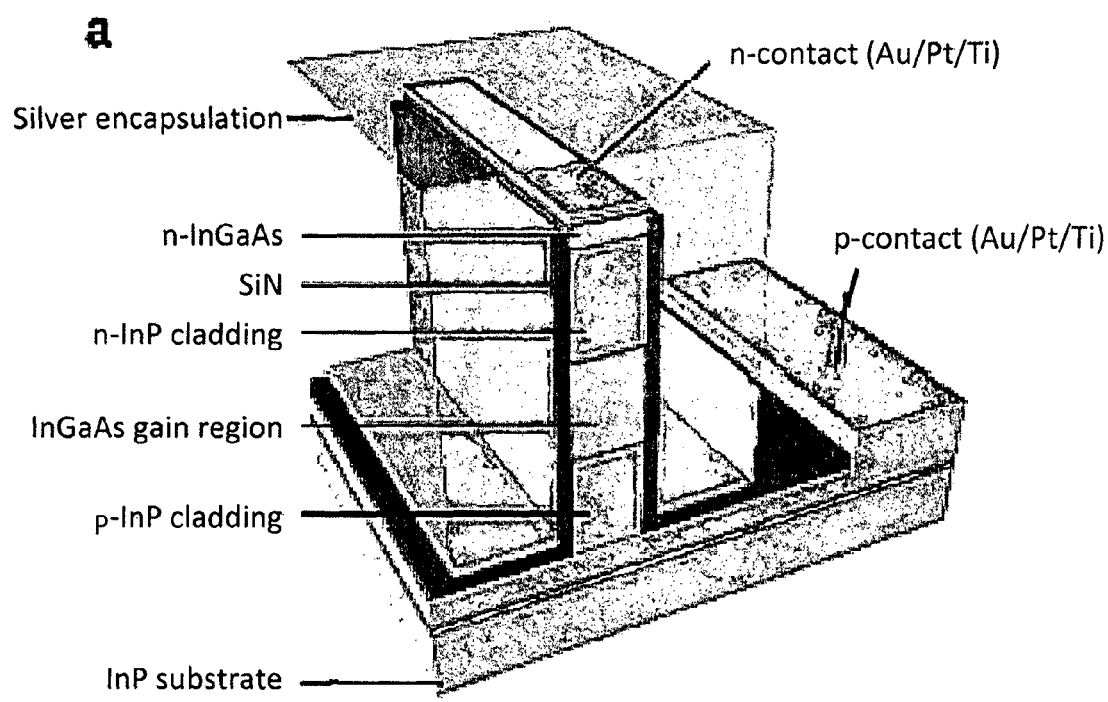
FIG. 2 illustrates in cross-section view a modified prior art MIM waveguide structure employing a plasmon gap mode in which the MIM structure is effectively turned 90° onto its side.
Figure 3:
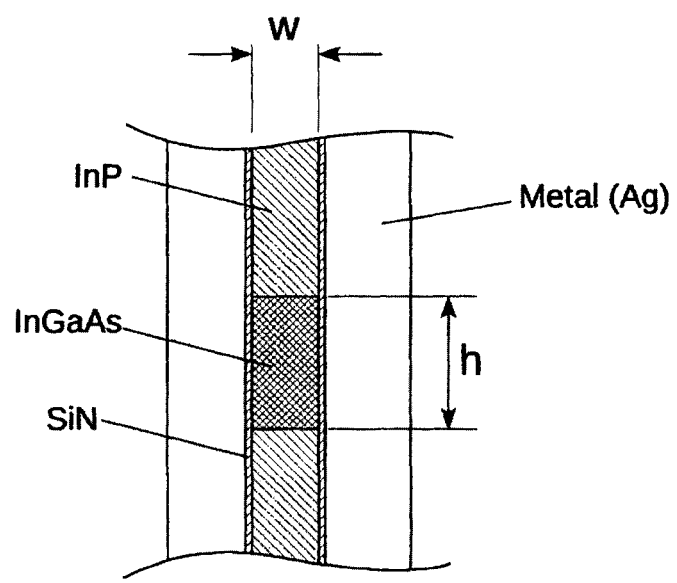
FIG. 3 shows an idealized cross-section for a prior art waveguide similar to that of FIG. 2 in which the height (h) of the InGaAs region is set at 90 nanometers (nm) and the width (W) of the InGaAs region varied from 300 to 20 nm.
Figure 4:
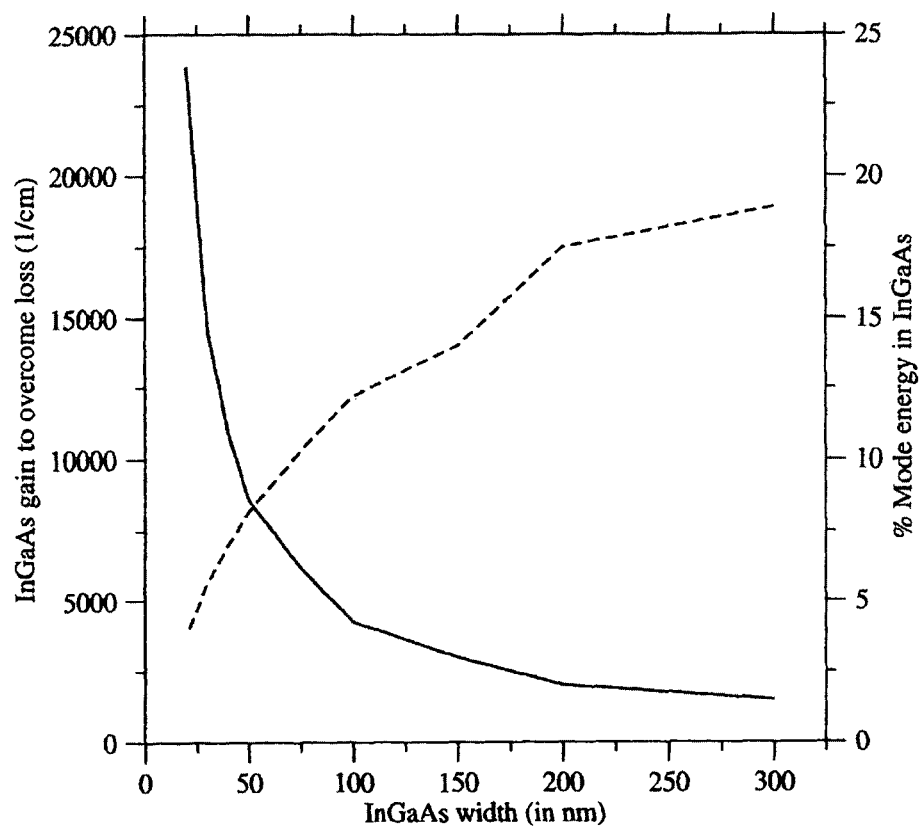
FIG. 4 is a graph plotting the gain required to overcome losses and also the percentage of the mode energy contained in the InGaAs gain region of FIG. 3 as a function of the width (W)

Furthermore, the dashed line in FIG. 6 shows the percentage of modal energy in the InGaAs, which is much greater than for the waveguide of FIG. 3, which represents the prior art [1]. In this case a significant percentage of the modal energy overlaps the gain medium. The gain does not increase dramatically with decreased InGaAs width because the amount of energy in the metal at the centre of the waveguide reduces with decreasing width. This reduction occurs because of the strong effective refractive index discontinuity at the interface of the semiconductor core 18 and the low refractive index material, which is typically air. The higher percentage of modal energy in InGaAs allows for smaller lasers and amplifiers.

In the prior art [1] the sections of MIM waveguide flanking the middle section with the low-band gap semiconductor optical gain material, were filled predominately with semiconductor material, which typically has a high refractive index in the range of 3 to 4. Thus the refractive index discontinuity between the MIM waveguide sections was low, leading to weaker confinement of the optical mode in the middle section, and also increased energy in the metal cladding of the MIM waveguide.

The improved MIM waveguide structure 10 introduces a new element to the prior art shown in FIG. 3. The new element is the low refractive index material 19, typically with refractive index less than 1.5, which is placed on either side of the middle MIM waveguide section. The low refractive index material 19 occupies the majority of the MIM waveguide sandwich structure. Two thin layers of higher-band gap doped semiconductor material 15 and 17, close to the respective metal layers 14 and 16, still remain in the new MIM waveguide structure, allowing current to be transferred from the contacts to the semiconductor core 18 in the middle MIM waveguide section.

MIM waveguides with a low refractive index insulator core have a much smaller proportion of the TM0 modal energy in the metal than for MIM waveguides with a high refractive index core. For the structure 10 of FIG. 5, in the two wave guide sections at the sides (the region away from the semiconductor core 18) the MIM mode profile would be like that for an MIM waveguide with predominately an air (or low refractive index) core. On the other hand, in the middle waveguide section with the semiconductor core 18 the MIM mode profile would be like that for an MIM waveguide with predominately an InGaAs (or high refractive index) core. However, due to the high conductivity of the metal, there cannot be any abrupt changes in the mode profile in the metal. Hence, when the InGaAs width is small, say a few tens of nanometers, and on the order of the penetration depth of light into the metal, the proportion of modal energy in the metal next to the semiconductor core 18 is greatly reduced compared to the case when the InGaAs width is large. This reduced metallic loss for a small width semiconductor core helps maintain a relatively low gain requirement to overcome metallic losses even for thin InGaAs regions.

Preferably the waveguide structure 10 further comprises two thin dielectric layers 20 and 22 (in this case SiN) provided between the doped semiconductor layers 15 and 17 and the two metal layers 14 and 16 respectively. The provision of each thin dielectric layer allows the adjoining metal layer to be annealed without shorting the semiconductor PIN junction. The dielectric layers 20 and 22 are made with as high a refractive index as possible, and are made as thin as possible, in order to maximize the energy confinement in the InGaAs region [2]. The confining metal layer makes electrical contacts to the respective p and n doped semiconductor layers in a region away from where the optical mode is. As well as allowing the electrical contacts to be annealed it also allows the use of metals and/or semiconductor materials which exhibit low contact resistance at this interface. Furthermore the electrical contact area can be made much larger than the active region width, allowing for lower current densities through the typically high resistance electrical contacts.

The metal contacts are made away to the side of the InGaAs semiconductor gain region on which the optical mode is centred. The current is transported from the contacts to the InGaAs gain region by thin higher band gap doped semiconductor, in this case InP.

A possible issue with the practical use of the electrically pumped MIM waveguide described above is the ability to inject sufficient current into the InGaAs semiconductor core 18 through the thin InP layers 15, 17 connecting the metal/semiconductor contacts with the InGaAs. Particularly for the p-doped InP (layer 15), significant resistance can occur due to the need to have the distance from the InGaAs to the metal/semiconductor contact at least several hundred nanometers, and possibly several microns long. For this case it can been seen that there is an advantage in having the width of the InGaAs region small, as there is less InGaAs to pump and the amount of current to be carried in the InP is reduced.

Figure 7:
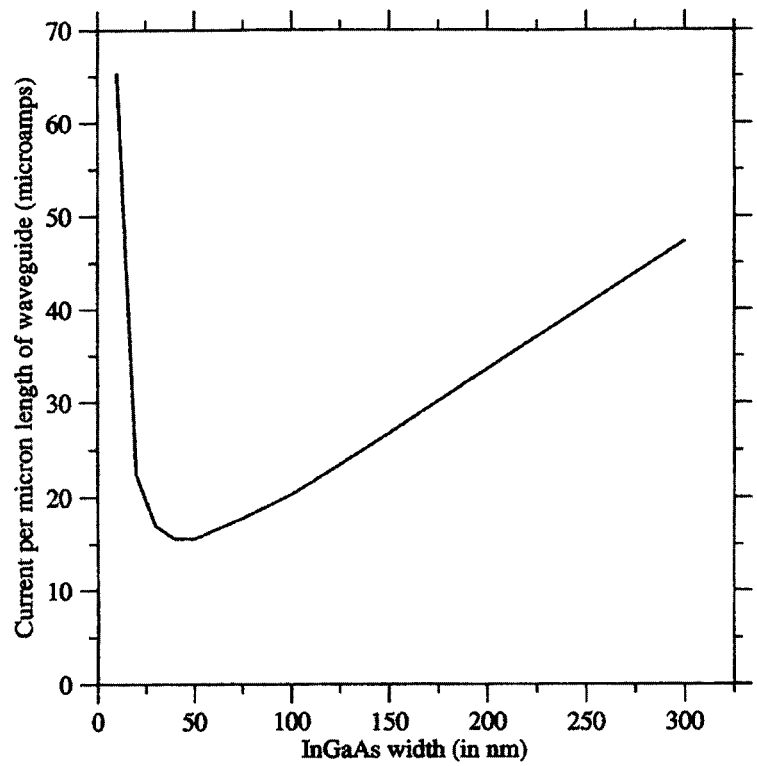
FIG. 7 is a graph plotting the current required per micron length of MIM waveguide structure of FIG. 5, to be pumped into the InGaAs region in order to overcome metallic losses, versus the InGaAs width.

FIG. 7 shows a graph of the current required per micron length of MIM waveguide, to be pumped into the InGaAs in order to overcome metallic losses, versus the InGaAs width. The calculations are based on typical values of InGaAs for surface recombination, optical gain, Auger recombination and spontaneous emission. It can be seen that a minimum in the required current occurs with an InGaAs semiconductor section width of approximately 40 nm. Again the modest material gain required to overcome the optical losses of the waveguide structure 10 given here, even when the semiconductor gain region 18 is thin, gives a significant advantage in being able to make practical and useful plasmon mode lasers and amplifiers.

A first embodiment of a method of manufacturing the proposed improved MIM waveguide structure will now be described with reference to FIG. 8. An advantage of the proposed structure is that it may be fabricated with high precision of the critical elements by the use of epitaxial growth, lithography, deposition of dielectrics and metals, reactive ion etching (RIE) and selective chemical wet etching, and wafer bonding, as will be described below. In particular the structure permits a self aligned semiconductor gain medium to be formed with precise control over the size and shape of the gain medium.

To illustrate these advantages a possible manufacturing process would be as follows: An epitaxial wafer heterostructure, illustrated in FIG. 8 (a), is produced via standard semiconductor epitaxial growth such as metal organic vapour phase epitaxy (MOVPE). At this stage the epitaxial wafer comprises a bottom layer 30 of n-InP substrate, an InGaAs etch stop layer 32, a n-InP layer 34, an InGaAs semiconductor core layer 36, with a p-InP layer 38 on top. The top layer 38 is coated with a first thin dielectric (SiN) layer 40, then patterned via lithography to make openings for a first set of electrical contacts 42, as shown in FIG. 8 (b). Adhesive metal such as titanium covered with gold is applied over the contact openings.

Figure 8:
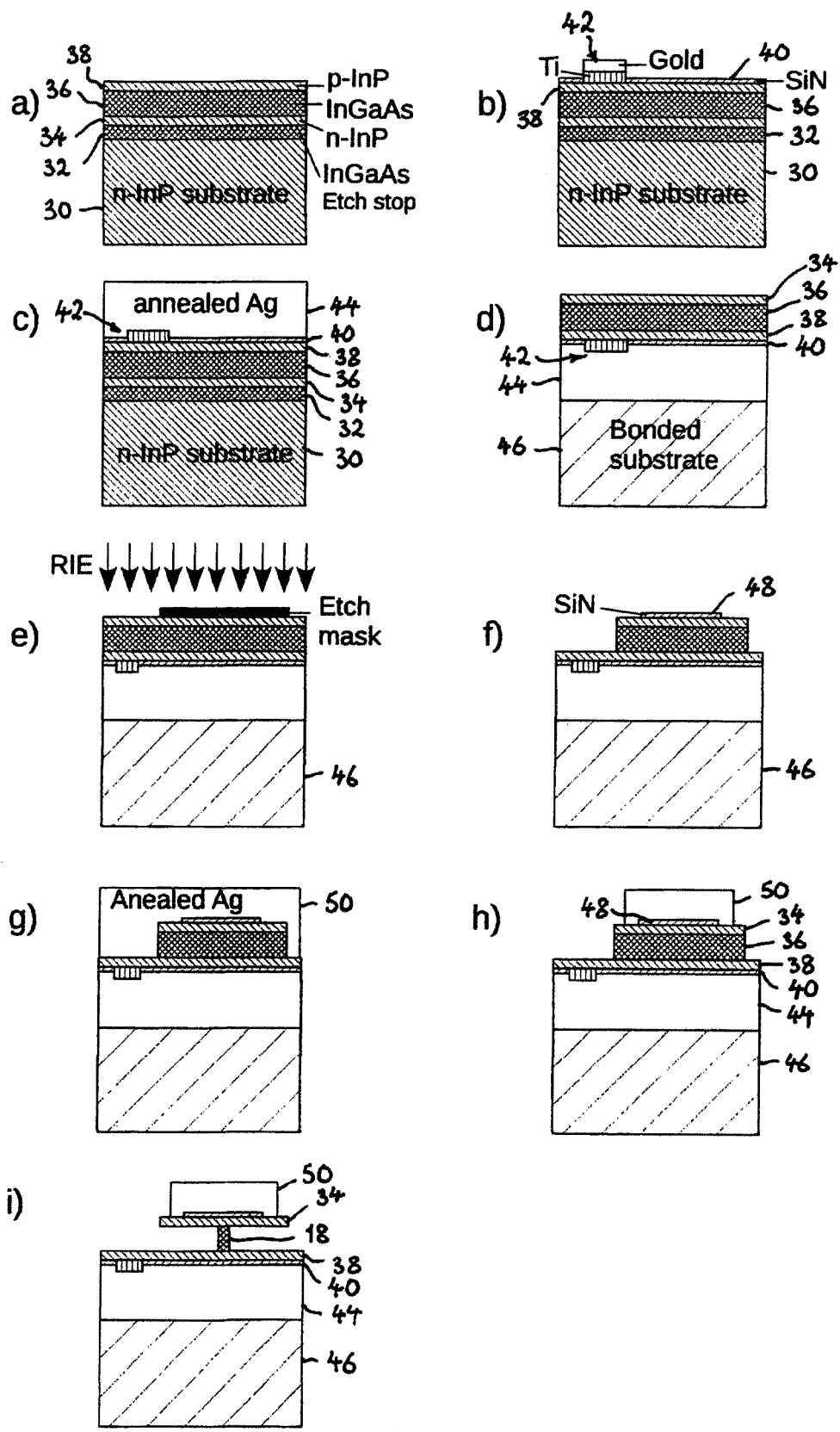
FIG. 8 illustrates a first embodiment of a method of manufacturing an improved MIM waveguide structure in accordance with the invention.

A first metal layer 44 of silver (which is the noble metal with lowest optical losses in the near infra red and visible ranges) is deposited over the wafer, as shown in FIG. 8 (c), then annealed to improve the crystal structure and also causing it to mix with the gold bonding it to the wafer surface. During the annealing process the gold dissolves into the silver near the gold, and the whole silver layer is held tightly to the SiN layer 40 via the Ti layer on the InP, which also forms an electrical contact to the p-InP layer 38. The wafer can then be wafer-bonded to another wafer substrate 46, as shown in FIG. 8 (d). This bonding may be done with metallic bonding or the use of polymer resins. Then the epitaxial wafer is flipped over and the original n-InP substrate layer 30 is removed by chemical etching. The InGaAs etch stop layer is also removed by chemical etching. FIG. 8

(*d*) shows the structure turned 180° with the bonded substrate now at the bottom and the original n-InP substrate layer 30 and InGaAs etch stop layer 32 removed.

Deposition of an etch mask material and/or lithography is used to define an accurate etch mask, on top of the bonded wafer, which defines the critical dimensions and shape of the MIM waveguide. This is the most critical lithography in the process. Reactive ion etching (RIE) is used to transfer the etch mask shape isotropically into the InP/InGaAs wafer, as shown in FIG. 8 (*e*). The etch mask is removed by wet chemical etching, then a second thin dielectric layer 48, in this case SiN, is deposited over the top surface of the wafer, as shown in FIG. 8 (*f*). Lithography and either RIE dry etching or wet chemical etching can be used to limit the SiN just to a region approximately in the middle of the plateau formed in the last step. A second metal layer 50 (a noble metal such as silver) is then deposited over the top of the wafer and annealed, as shown in FIG. 8 (*g*) to give a good crystal structure and also form a good contact with the semiconductor core exposed at the sides of the MIM waveguide.

Additional layers of other metals (not shown) may possibly be used to protect the silver and be used as etching masks. Lithography and either dry or wet etching is then used to remove the silver and other metal from areas outside the MIM waveguide, as shown in FIG. 8 (*h*). Lithography and etching are used to remove the silver from all but the centre region of the plateau defined by the RIE etching. Note that the silver overlaps the SiN region, so there is still an electrical contact between the silver and the n-InP.

Selective wet chemical processes of either etching or oxidization are used to remove the InGaAs semiconductor core material 36 under the top metal layer 50 and InP layer 34, starting from the sides, and replace it with a low refractive index material. In this embodiment the removed InGaAs material is simply replaced with air, however it will be appreciated that it may be replaced with another suitable low refractive index, non-semiconductor insulating material. The amount of removal or replacement is controlled to leave just a section of InGaAs semiconductor material 18, forming the core of the middle section of the MIM waveguide, as shown in FIG. 8 (*i*). Etching progresses uniformly from each edge of the plateau, leaving a thin section of InGaAs in the centre of the waveguide. By controlling the etch time, and also the shape of the edges defined in step (e), great control over the size, shape and position of the InGaAs in the center of the waveguide can be achieved. The etching processing used to remove or replace the InGaAs semiconductor core material 36 can to some extent be used to transfer the pattern of the InP layer at the edge of the waveguide into the InGaAs that remains in the centre of the waveguide.

Figure 9:
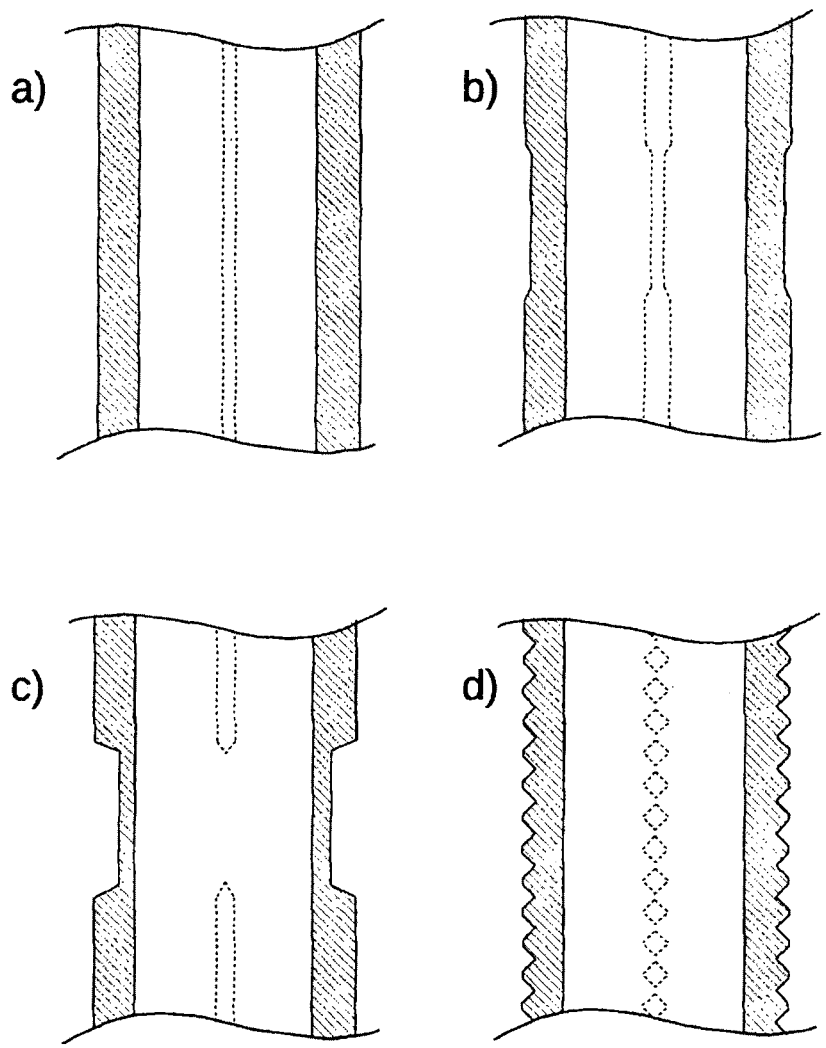
FIGS. 9 (a), (b), (c) and (d) illustrate several examples of how the shape of the InGaAs semiconductor core of the improved MIM waveguide structure can be modified.

Since the edge of the waveguide is well away from the optical mode maximum in the centre of the waveguide, perturbations at the edge have little effect on the propagating mode. However, the changes in the thickness of the central InGaAs semiconductor core 18 can have significant effects on both the properties of the InGaAs gain medium, and the propagation of the optical mode passing along the waveguide. Some important examples of how the shape of the InGaAs semiconductor core 18 can be modified are shown in FIG. 9. Here it is shown how the InGaAs can be completely removed in parts of the waveguide, made thinner in certain areas, or made to be a line of dots with controlled size and spacing.

By controlling the shape of the lithographically defined edge of the waveguide, various useful shapes of the semiconductor core can be obtained. As shown in FIG. 9 (*a*) for straight edges, a straight core region is achieved. In FIG. 9 (*b*) by modulating slightly the overall width of the waveguide, the width of the semiconductor-filled middle section can be modified significantly. This may lead to active and passive regions of the MIM waveguide. As shown in FIG. 9 (*c*) with stronger modulation of the overall waveguide width, the semiconductor core can be removed in certain regions. This removal can be used to create reflections via the waveguide discontinuity, forming for example Bragg reflectors when a number of discontinuities are used. On certain types of cavities where standing waves occur, the active semiconductor can be removed from regions where the electric field is a minimum. As shown in FIG. 9 (*d*) more complex width modulation schemes can be employed to make the semiconductor core consist of small isolated islands, which may have the advantage of quantum confinement effects. This ability to precisely control the size, shape and position of the active semiconductor core material is a key advantage of the plasmonic waveguide concept presented here. The specific advantages of the various shapes will be discussed below.

The low-band gap semiconductor core 18 of the waveguide, which is the optical gain material, does not necessarily have to be a homogeneous material. For example, via epitaxial growth the semiconductor core could be made of layers of lower and higher band gap material, like in multi-quantum well gain medium. Via various chemical etching processes this semiconductor core region can also be etched to make the middle section of the MIM waveguide thin.

Figure 10:
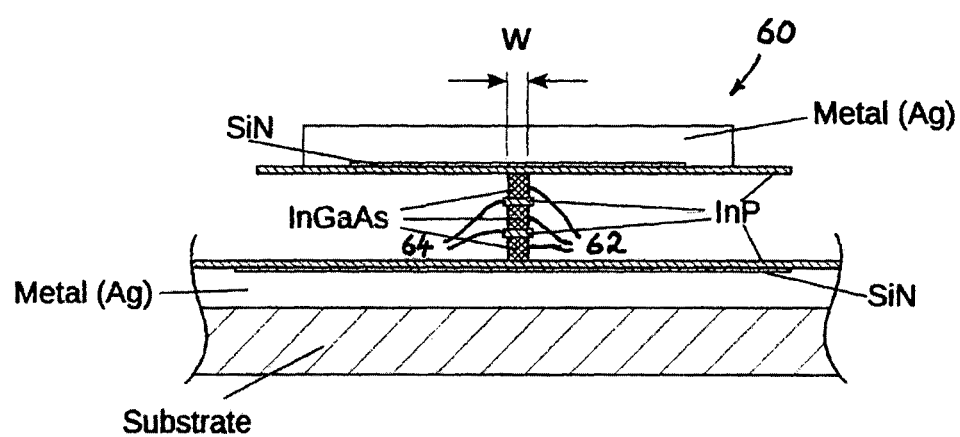
FIG. 10 illustrates in cross-section view a second embodiment of an improved MIM waveguide structure with a series of thin regions of low band-gap semiconductor core material; and, FIG. 11 illustrates in cross-section view a third embodiment of an improved MIM waveguide structure with improvements to help with current transport from the metal/semiconductor contacts to the InGaAs.

FIG. 10 shows a cross-section of a second embodiment of a waveguide structure 60 with a series of such thin sections 62 of low band-gap semiconductor core material in the middle of the waveguide. In the epitaxial growth process the semiconductor core material could be grown out of a number of layers of semiconductors of various compositions. Here a number of layers 62 of InGaAs low band-gap semiconductor core material are shown separated by thin InP layers 64. The height of the low-band gap sections 62 in the core of the waveguide can be made small enough so that quantum confinement effects are seen, to improve the performance of the devices. For wide gain regions, (greater than say 30 nm wide) the gain material will look like multi-quantum well gain material, which can have significant performance improvements compared to bulk semiconductor.

When the width of the gain region is made small (less than approximately 30 nm) the quantum confinement effects may occur in two dimensions. In this case the long thin wire like gain regions are called quantum wires and can give a significant performance improvement in terms of optical gain, differential gain and temperature stability compared to bulk or quantum well gain material.

In the prior art [2],[3], wet etching semiconductor structures with multi-quantum well or thin InGaAs sections between InP cladding was proposed to form stacks of, or single quantum wires. In these prior art [2],[3], MIM waveguides, extra energy confinement on the small quantum confined middle section of the MIM waveguide is obtained by making the width (w in FIG. 3) of the middle section smaller than that of the MIM sections on either side which contain InP. However, the optical properties of these prior art MIM waveguides are not as good as the improved MIM waveguide described here, and illustrated in FIG. 5. Furthermore, the manufacture of these quantum-confined prior art waveguides is difficult, and a successful amplifying waveguide has not been achieved.

When specific patterning of the side of the waveguide is performed to cause the core to be formed out of series of dots or squares, (see FIG. 9) then when the dimensions of the dot are small (say less than a few tens of nanometers) quantum confinement effects can occur in three dimensions. Such semiconductor structures are called quantum dots and show even greater material advantages compared to quantum wire, quantum well and bulk semiconductor gain material.

A key advantage of the waveguide structure presented here is that it allows the manufacture of the MIM waveguide, with electrically contacted and pumped quantum wires and quantum dots. Furthermore, the quantum wires and dots are self aligned by the manufacturing process to be in the centre of the waveguide where the propagating mode electric field is a maximum. Finally, by using lithography, the size and shape, and position of the quantum wires and dots can be precisely controlled. The size of the quantum dot or wire can control the wavelength of light at which it exhibits gain or absorption.

Any particular optical circuit made of waveguides generally works with wavelengths in one small region of the electromagnetic spectrum. By controlling the size, regions of the waveguide can be made which act only as passive waveguides in that they don't absorb or amplify light, even when they are not electrically pumped. Other regions can be made as active waveguides, where absorption or amplification of light can occur. Creating active and passive waveguide structures in the same circuit, efficiently and economically is another major advantage of the described MIM waveguide structure and method of manufacture.

Figure 11:
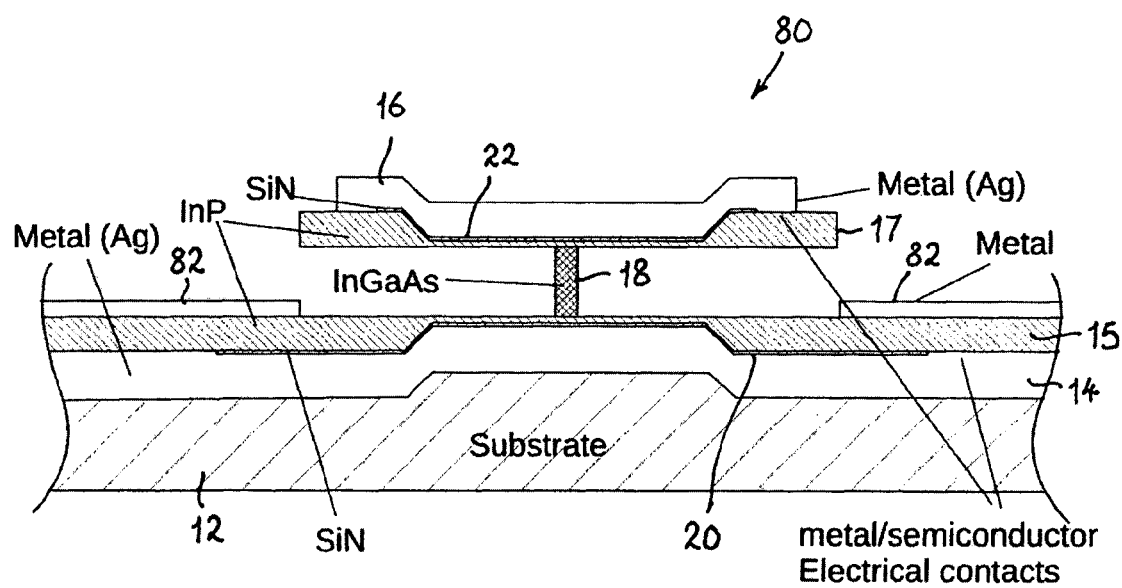

As mentioned earlier, the current for the InGaAs region has to be carried from the electrical contacts to the InGaAs via a thin layer of InP. To maximise the amount of modal energy in the InGaAs and also minimize the gain required to overcome metallic losses, this InP layer should be made as thin as possible. However, to reduce the resistance to current flow, the InP needs to be made as thick as possible, so there is a trade off to be made. To mitigate the trade off, some additional features can be added to the proposed MIM waveguide as shown in FIG. 11. FIG. 11 illustrates a third embodiment of an improved MIM waveguide structure 80 with improvements to help with current transport from the metal/semiconductor contacts to the InGaAs. The MIM waveguide structure 80 is similar to the first embodiment illustrated in FIG. 5, and therefore the same reference numerals will be used to identify the similar parts which will not be described again in detail here. In this embodiment both InP layers 15, 17 are indented near the InGaAs-filled middle section 18 where the optical mode exists, but away from the centre the InP layers 15, 17 are thicker allowing more current flow. Also the bottom InP layer 15 is coated with a thin layer of metal 82 outside the MIM waveguide to improve transport current from the distant metal/semiconductor electrical contacts.

Now that preferred embodiments of the MIM waveguide structure and method of manufacture have been described in detail, it will be apparent that the described embodiments provide a number of advantages over the prior art, including the following:

(i) One advantage of the MIM waveguide structure is that it allows amplifying MIM waveguides to be made which require low power, due to the small size of the optical gain material, on which the optical mode is well confined.
(ii) Another advantage of the MIM waveguide structure is that it is straightforward to manufacture with high precision of the critical elements.
(iii) The structure permits an electrically-contacted, self-aligned semiconductor gain medium to be formed with precise control over the size, shape and position of the gain medium.
(iv) A further advantage of the proposed structure is that it may be fabricated by the use of conventional techniques of epitaxial growth, lithography, deposition of dielectrics and metals, reactive ion etching (RIE) and selective chemical wet etching, and wafer bonding.

It will be readily apparent to persons skilled in the relevant arts that various modifications and improvements may be made to the foregoing embodiments, in addition to those already described, without departing from the basic inventive concepts of the present invention. Therefore, it will be appreciated that the scope of the invention is not limited to the specific embodiments described.

REFERENCES

[1] M. T. Hill et al., "Lasing in metal-insulator-metal sub-wavelength plasmonic waveguides", Optics Express, 22 Jun. 2009, Vol 17, No 13, pp. 11107-11112.
[2] M. T. Hill, "Metallic nano-cavity lasers at near infrared wavelengths" Proc. SPIE 7394, Plasmonic: Metallic Nanostructures and their Optical Properties VII, 739409 (Sep. 2, 2009); doi: 10.1117/12.825878
[3] M. T. Hill, "Electrically pumped gap-plasmon mode semiconductor core lasers" Proc. SPIE 7757, Plasmonic: Metallic Nanostructures and their Optical Properties VII, 77570S (Sep. 10, 2010); doi: 10.1117/12.861358
[4] M. T. Hill, "Infrared plasmonic nano-lasers based on Metal Insulator Metal waveguides" 23$^{rd}$ Annual Meeting of the IEEE Photonics Society, 7-11 Nov. 2010, pp 696-697.

The invention claimed is:

1. A metal-insulator-metal (MIM) waveguide structure for nano-lasers or optical amplifiers, the structure comprising:
a substrate on which are supported first and second metal layers which form electrical contacts for the waveguide structure;
a narrow ridge of low-band gap semiconductor core, which forms an optical gain material, sandwiched between the first and second metal layers and surrounded on both sides by a low refractive index material;
first and second layers of thin higher-band gap doped semiconductor material provided between the respective first and second metal layers and the low-band gap semiconductor core and,
first and second thin dielectric layers respectively provided between the first layer of doped semiconductor material and the first metal layer, and the second layer of doped semiconductor material and the second metal layer wherein, in use, the gain required to overcome metallic loss in the waveguide is reduced because of the strong refractive index discontinuity at an interface of the optical gain material and the low refractive index material.

2. A MIM waveguide structure as defined in claim 1, wherein the first and second layers of metal are of a noble metal.

3. A MIM waveguide structure as defined in claim 2, wherein the first and second layers of noble metal are annealed.

4. A MIM waveguide structure as defined in claim 1, wherein the low-band gap semiconductor core of the waveguide structure is not a homogeneous material.

5. A MIM waveguide structure as defined in claim 4, wherein the semiconductor core is made of layers of lower and higher band gap material via epitaxial growth.

6. A MIM waveguide structure as defined in claim 1, wherein the semiconductor core is etched via a chemical etching process to achieve only a thin section of low band-gap active material in the centre of the waveguide structure.

7. A MIM waveguide structure as defined in claim 1, wherein the optical gain material is InGaAs semiconductor material which is suitable for optical wavelengths in the region of 1.5 micron.

8. A MIM waveguide structure as defined in claim 1, wherein the low refractive index material, provided on both sides of the optical gain material, is an insulating, non-semiconductor material with a refractive index of less than 1.5.

9. A MIM waveguide structure as defined in claim 8, wherein the low refractive index material is air, which has a refractive index of 1.0, giving the strongest effective refractive index discontinuity at the interface.

10. A MIM waveguide structure as defined in claim 8, wherein the size and shape of the optical gain material is a few tens of nanometers or less in two or more dimensions, thus allowing improved gain medium characteristics, and permitting local control of the emission and absorption wavelengths of the optical gain medium, due to quantum confinement effects.

11. A MIM waveguide structure as defined in claim 10, wherein the local control of emission and absorption wavelengths along the MIM waveguide is employed for creating active (absorbing or amplifying) sections of waveguide, or passive (only guides light, without amplification) sections of waveguide.

12. A method of manufacturing a metal-insulator-metal (MIM) waveguide structure for nano-lasers or optical amplifiers, the method comprising the steps of:
  growing an epitaxial wafer via standard semiconductor techniques, the epitaxial wafer comprising a first substrate layer, a first thin higher-band gap doped semiconductor n-InP layer, a layer of low-band gap semiconductor core material, and a second thin higher-band gap doped semiconductor p-InP layer on top;
  depositing a first layer of metal over the wafer;
  bonding a second wafer substrate to the first metal layer to form a bonded wafer;
  removing the first substrate layer to expose the n-InP layer;
  depositing a second layer of metal over the bonded wafer and then removing the metal from areas outside the desired MIM waveguide structure, wherein the first and second metal layers form electrical contacts for the waveguide structure; and,
  removing the semiconductor core material under the second metal layer and n-InP layer and replacing it with a low refractive index material to leave just a narrow ridge of semiconductor core material in the centre of the waveguide structure, which forms an optical gain material, sandwiched between the first and second metal layers and surrounded on both sides by the low refractive index material; and, prior to the step of depositing a first layer of metal, the steps of:
  coating the p-InP layer with a first thin dielectric layer; and,
  patterning the first thin dielectric layer to make openings for a first set of electrical contacts;
  and, prior to the step of depositing a second layer of metal, the step of:
  coating the n-InP layer with a second thin dielectric layer;
  wherein the first thin higher-band gap doped semiconductor n-InP layer and the second thin higher-band gap doped semiconductor p-InP layer are provided between the respective first and second metal layers and the low-band gap semiconductor core material; the first and second thin dielectric layers being respectively provided between the first thin higher-band gap doped semiconductor n-InP layer and the first metal layer, and the second thin higher-band gap doped semiconductor p-InP layer and the second metal layer; wherein, in use, the gain required to overcome metallic loss in the waveguide is reduced because of the strong refractive index discontinuity at an interface of the optical gain material and the low refractive index material.

13. A method of manufacturing a MIM waveguide structure as defined in claim 12, the method further comprising, prior to the step of coating the n-InP layer with the second dielectric layer, the steps of:
  defining an accurate etch mask on top of the bonded wafer, which defines the critical dimensions and shape of the MIM waveguide; then
  reactive ion etching (ME) dry etching to transfer this pattern isotropically into the wafer.

14. A method of manufacturing a MIM waveguide structure as defined in claim 13, comprising using lithography to limit the second dielectric layer just to a region approximately in the middle of a plateau formed in the last step, permitting electrical contacts to be made at the edges of the plateau.

15. A method of manufacturing a MIM waveguide structure as defined in claim 14, further comprising using additional layers of metal as etching masks.

16. A method of manufacturing a MIM waveguide structure as defined in claim 12, wherein the low refractive index material is air, which has a refractive index of 1.0, giving the strongest effective refractive index discontinuity at the interface.

17. A method of manufacturing a MIM waveguide structure as defined in claim 13, comprising controlling the etch time, and also the shape of the edges of the etch mask used to transfer the etch mask pattern isotropically into the wafer, to control the size, shape and position of the semiconductor core material of the waveguide structure.

18. A method of manufacturing a MIM waveguide structure as defined in claim 17, comprising using the etching processes to remove or replace the semiconductor core material.

19. A method of manufacturing a MIM waveguide structure as defined in claim 18, wherein the semiconductor core material removed is InGaAs, which is replaced with air or another low refractive index material with a refractive index of less than 1.5, and wherein the amount of removal or replacement is controlled to leave just a narrow ridge of InGaAs semiconductor core material in the centre of the waveguide structure.

20. A method of manufacturing a metal-insulator-metal (MIM) waveguide structure for nano-lasers or optical amplifiers, the method comprising:
  supporting on a substrate first and second metal layers which form electrical contacts for the waveguide structure;
  sandwiching a narrow ridge of low-band gap semiconductor core, which forms an optical gain material, between the first and second metal layers and surrounded on both sides by a low refractive index material;

forming first and second layers of thin higher-band gap doped semiconductor material between the respective first and second metal layers and the low-band gap semiconductor core; and, forming first and second thin dielectric layers respectively between the first layer of doped semiconductor material and the first metal layer, and the second layer of doped semiconductor material and the second metal layer, wherein the gain required to overcome metallic loss in the waveguide is reduced because of the strong refractive index discontinuity at the interface of the optical gain material and the low refractive index material.

* * * * *